United States Patent [19]

Davis

[11] 4,417,216

[45] Nov. 22, 1983

[54] OPERATIONAL AMPLIFIER

[75] Inventor: William F. Davis, Tempe, Ariz.

[73] Assignee: Motorola, Inc., Schaumburg, Ill.

[21] Appl. No.: 293,753

[22] Filed: Aug. 17, 1981

[51] Int. Cl.³ .............................................. H03F 3/04
[52] U.S. Cl. .................................... 330/294; 330/310
[58] Field of Search ............... 330/262, 294, 307, 310, 330/288

[56] References Cited

U.S. PATENT DOCUMENTS 4,257,006  3/1971  Schaumann ......................... 330/294

OTHER PUBLICATIONS

The Electronic Engineer "Hybridization" Jun. 1967.

Primary Examiner—James B. Mullins
Assistant Examiner—Gene Wan
Attorney, Agent, or Firm—Vincent B. Ingrassia

[57] ABSTRACT

An operational amplifier includes an input stage, an output stage including first and second NPN output transistors and an intermediate stage including first and second emitter follower transistors. In this manner, a $\beta^3$ current gain is achieved from the amplifier output to the output of the input stage to reduce output loading effects on the input stage. A first capacitor network is coupled between the amplifier output and the output of the input stage to frequency stabilize the amplifier. A second capacitor is coupled between the base terminals of the first and second emitter follower transistors, and a resistor (or diode) is coupled between the emitter of the first emitter follower transistor and the base of the second emitter follower transistor. This network frequency stabilizes the parasitic feedback loop associated with the intermediate stages, the NPN output transistor and the first capacitor network.

7 Claims, 2 Drawing Figures

OPERATIONAL AMPLIFIER

BACKGROUND OF THE INVENTION

1. Field of the Invention:

This invention relates generally to operational amplifiers and, more particularly, to an operational amplifier having an output stage comprised of only NPN output transistors and providing a $\beta^3$ current gain from the input of the second stage to an open collector output. Amplifier frequency stability is achieved by placing a stabilizing capacitor across the second stage which forms a feedback loop about the second stage which loop is itself frequency stabilized by a stabilizing network.

2. Description of the Prior Art:

Most prior art operational amplifiers comprise an input gain stage, usually of the differential comparator type, an output stage including NPN and PNP transistors coupled in a push-pull configuration, and a second gain stage coupled between the input and output stages. The second stage generally consists of a gain transistor preceded by a single follower transistor having a base coupled to the output of the input stage. As a result of the current gains of the second stage gain transistor, the preceding follower transistor, and the pull-up NPN or the pull-down PNP output transistors, a $\beta^3$ current gain is achieved from the output of the input stage to the amplifier output. This substantially reduces base current loading on the input stage which, if unchecked, would cause the input stage offset voltage to shift with load current.

In order to achieve a higher frequency response, greater output swing, reduce output stage second order peaking with capacitive loads, and simplify integrated circuit construction, it is desirable to provide an operational amplifier second stage and output stage which incorporates only NPN transistors. In order to accomplish this, it is necessary that an NPN transistor with its emitter terminal which is connected to some potential (e.g. ground) and a collector terminal coupled to the load serve simultaneously as the second gain stage and the output pull down. Such a stage as is shown and described in co-pending application Ser. No. 244,411 now abandoned filed Mar. 16, 1981 and assigned to the assignee of the present invention. The incorporation of such an output stage in an operational amplifier still requires that precautions be taken to prevent unwanted base current loading on the input stage. The inclusion of a single emitter follower transistor between the input of the NPN output stage and the output of the input stage would not be sufficient to provide the necessary input stage current isolation from output load currents. However, the inclusion of additional current gain in the second stage will minimize loading at the output of the input stage. However, placing a stabilizing capacitor across the second stage will result in a parasitic second stage loop frequency instability.

U.S. Pat. No. 3,416,092 issued Dec. 10, 1968 and assigned to the assignee of the present invention describes an amplifier having an all NPN output stage including an NPN pull-down transistor also serving as a second gain stage and the necessary first and second NPN follower transistors connected between base of the pull-down transistor and the output of the amplifier's first stage. This patent suggests that a stabilizing capacitor be coupled between the collector of the pull-down transistor and the base of the follower transistor whose emitter supplies base current directly to the pull-down transistor. Unfortunately, this arrangement does not maximize amplifier gain due to additional excess phase shift in the remaining open loop circuit path not shunted or broadbanded by the stabilizing feedback capacitor.

SUMMARY OF THE INVENTION

It is an object of the present invention to provide an improved operational amplifier.

It is a further object of the present invention to provide a stable operational amplifier having an all NPN output stage and providing a $\beta^3$ current gain between the output of the operational amplifier and the output of the operational amplifier's input stage without sacrificing gain. This is accomplished by providing a frequency stabilizing feedback capacitor coupled to the amplifier's output and to the output of the amplifier's input stage and utilizing a second frequency stabilizing network to prevent second stage parasitic loop frequency instability.

According to a broad aspect of the invention there is provided an operational amplifier for providing load current to an external load, comprising: an input stage having at least one input and an output; an output stage including first and second NPN output transistors each having base, emitter, and collector terminals, said first NPN output transistor having an emitter coupled to said load for conducting load current thereto and said second NPN transistor having a collector coupled to said load for sinking load current therefrom; first and second emitter follower transistors coupled between the output of said input stage and the base of said second NPN output transistor; a first frequency stabilizing means coupled between the output of said first stage and the collector of said second NPN output transistor for stabilizing said amplifier, said first frequency stabilizing means, said second NPN output transistor and said first and second emitter follower transistors forming a loop; and second frequency stabilizing means coupled to said first and second emitter follower transistors and to said first frequency stabilizing means for stabilizing said loop.

The above and other objects, features and advantages of the present invention will be more clearly understood from the following detailed description taken in conjunction with the accompanying drawings, in which:

DESCRIPTION OF THE PREFERRED EMBODIMENT

Figure 1:
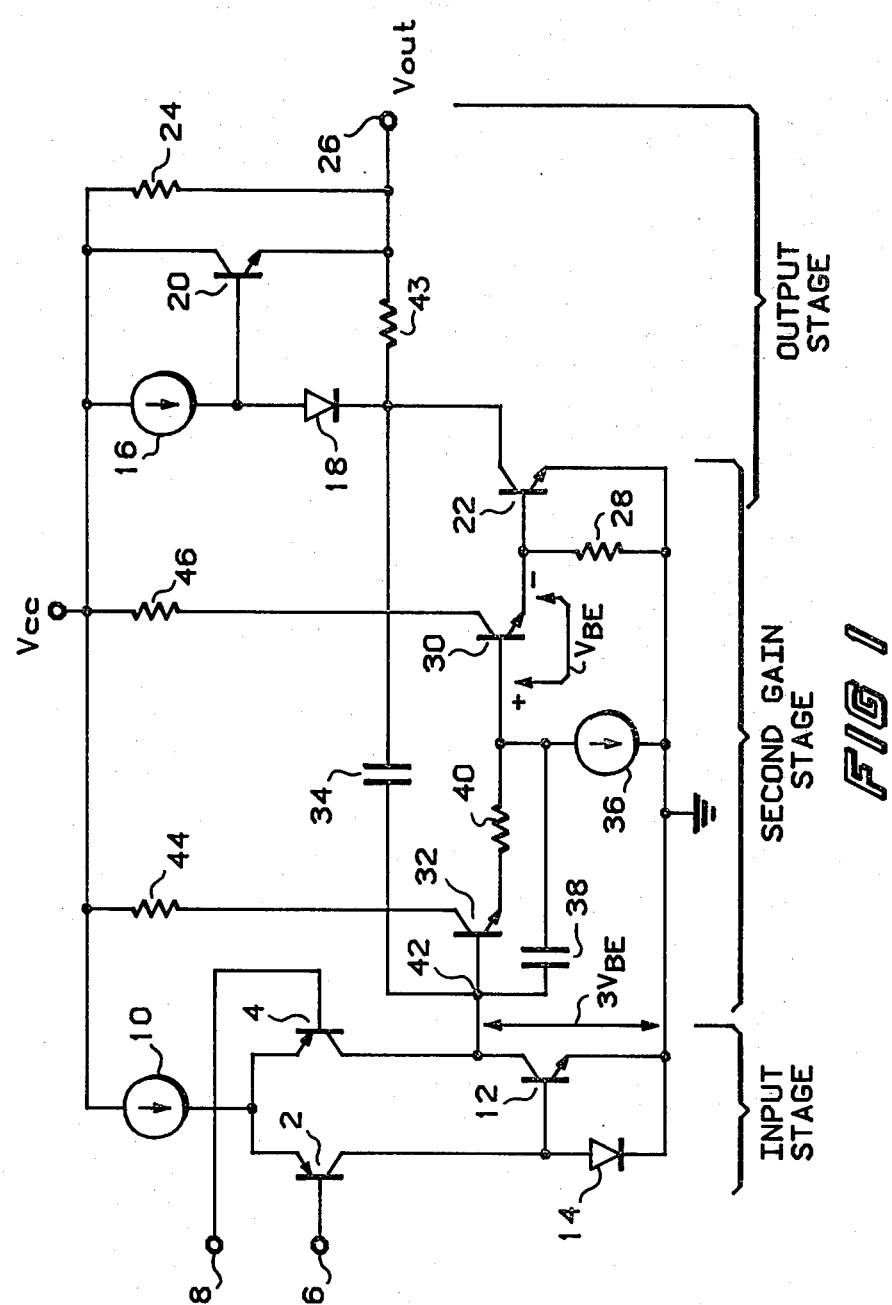
FIG. 1 is a schematic diagram of a first embodiment of the inventive operational amplifier.

FIG. 1 is a schematic diagram of an operational amplifier and is representative of one embodiment of the present invention. The circuit includes an input gain stage, a second gain stage and an output stage. The input stage comprises first and second PNP transistors 2 and 4 each having a base terminal coupled to input terminals 6 and 8 respectively. A current source 10 coupled to a source of supply voltage $V_{CC}$ supplies current to the emitters of transistors 2 and 4. The input stage includes a current mirror circuit comprised of NPN transistor 12 and diode 14. The collector of transistor 2 is coupled to the anode of diode 14 and to the base terminal of transistor 12. The collector of transistor 12 is coupled to the collector of PNP transistor 4 and to node 42. Both the emitter of transistor 12 and the cathode of diode 14 are coupled to a second source of supply voltage, in this case ground.

The input stage operates as follows. When transistors 2 and 4 are rendered more or less conductive respectively by lower and higher voltages appearing respectively at terminals 6 and 8, one-half the current being sourced by current source 10 flows more or less through the collector of transistor 2 and the collector of transistor 4. The current mirror action of diode 14 and transistor 12 will force a current in the collector of transistor 12 equivalent to that flowing in transistor 2. However, since the current flowing in the collector of transistor 12 will be pulled from the collector of transistor 4, the current into node 42 (the base of transistor 32) is equal to the difference between the collector currents of transistor 4 and transistor 2. For example when the collector current of transistor 2 is greater than the collector current in transistor 4, the difference in these collector currents will be pulled from node 42. Similarly when transistor 4 is more conductive than transistor 2. The difference in collector currents will be delivered into node 42. This particular differential input stage serves only as an example of an input stage. A single input common base or common emitter gain stage could also be included as an input gain stage.

The output portion of the circuit includes the current source 16, diode 18, a resistor 43 and NPN transistor 20. Current source 16 is coupled between $V_{CC}$ and the junction of the anode of diode 18 and the base terminal of transistor 20. The cathode of diode 18 and the emitter of transistor 20 are coupled to output terminal 26 and to the collector of an NPN second gain stage output transistor 22. The collector of transistor 20 is coupled to $V_{CC}$. A load resistor 24 is shown coupled across the collector-emitter terminals of transistor 20, although it can be coupled directly or capacitively coupled to ground. Second stage gain transistor 22 has an emitter coupled to ground and a base coupled to ground via bias resistor 28. It will be apparent to those skilled in the art that while device 18 is shown as a diode, it may be configured as an NPN transistor having its base electrode coupled to either its emitter or collector electrode. Further, current source 2 may be simply a resistor or a more complex transistor circuit. Although not shown for clarity, current limiting means would normally be provided in the event that the output were shorted to the positive rail.

When the voltage at the base of gain transistor 22 becomes sufficiently positive to turn transistor 22 on, load current will flow through load resistor 24, resistor 43, and transistor 22. If, for example, the load current were 5 milliamps and resistor 43 had a value of 100 ohms, the voltage drop across resistor 43 would be 500 mV. Therefore, the voltage at the cathode of diode 18 would be $V_{OUT}-500$ mV and the voltage at the base of transistor 20 would be approximately $V_{OUT}+200$ mV since the voltage drop across diode 18 is approximately 700 mV. Since the voltage at the base of transistor 20 is only 200 mV above $V_{OUT}$, transistor 20 is off and transistor 10 sinks not only the current flowing through resistor 43 but also the current being supplied by current source 16 through diode 18.

When the voltage at the base of gain transistor 22 becomes sufficiently lower, transistor 22 will begin to shut off and transistor 20 will begin to turn on. This occurs because as transistor 22 begins to turn off, the current through resistor 43 will reduce. If, for example, the drive current through resistor 43 fell to 100 microamps, the voltage at the cathode of diode 18 would become $V_{OUT}-100$ mV. Therefore, the voltage at the base of transistor 20 would be approximately $V_{OUT}+600$ mV. This is sufficient to cause transistor 20 to begin turning on and source current from the supply voltage to the output load.

As the voltage at the base of transistor 22 again increases, transistor 22 will again turn on pulling more current through transistor 22 causing a gradual reduction in the voltage at the base of transistor 20 slowly turning it off. A more detailed description of this output circuit may be found in U.S. patent application Ser. No. 244,411 filed Mar. 16, 1981 entitled "Amplifier Output Stage" and assigned to the assignee of the present invention.

As can be seen, two emitter follower transistors 30 and 32 have been placed between the output of the input stage and the base of second gain stage output transistor 22. That is, NPN transistor 32 has a base electrode coupled to node 42, a collector coupled to $V_{CC}$ through a current limit device 44 and an emitter coupled via resistor 40 to the base of transistor 30. Transistor 30 has a collector coupled to $V_{CC}$ through a current limit device 45 and an emitter coupled to the base of transistor 22. Capacitor 34 represents the Miller capacitance purposely placed between the base of transistor 32 and the collector of gain transistor 22 for purposes of broadbanding the second gain stage and generating a single pole response within the open loop amplifier. Since capacitor 34 is actually a negative feedback path from the output of the second stage to the input of the second stage, this Miller loop may oscillate given sufficient gain and excess phase shift. It will be recalled that in the prior art, only a single follower transistor was included in the Miller loop. By adding a second additional follower transistor as is the case in the FIG. 1 circuit, sufficient phase shift has been introduced into this Miller loop which will cause the loop to be marginally frequency stable, i.e., susceptible to oscillation.

This problem of marginal frequency stability of the second stage loop may be overcome by strategically placing a resistor-capacitor combination in the loop. It has already been stated that a resistor 40 is placed between the emitter of transistor 32 and the base of transistor 30. An additional capacitor 38 is coupled between the base of transistor 32 and the base of transistor 30. Resistor 40 and capacitor 38 add the required second stage loop frequency stability since the first emitter follower transistor 32 is effectively bypassed at high frequencies by capacitor 38 and resistor 40 isolates the emitter of transistor 32 making it less effective at high frequencies. To contribute excess phase shift, capacitor 38 effectively becomes a short circuit at high frequencies taking transistor 32 out of the circuit and resistor 40 further isolates transistor 32. Thus, at high frequency, the Miller capacitance 34 is effectively coupled only across the gain transistor 22 and a single emitter follower transistor 30, a proven frequency stable configuration. Typical values for capacitors 34 and 38 and resistor 40 are 10 picofarads, 10 picofarads and 3K ohms respectively.

Figure 2:
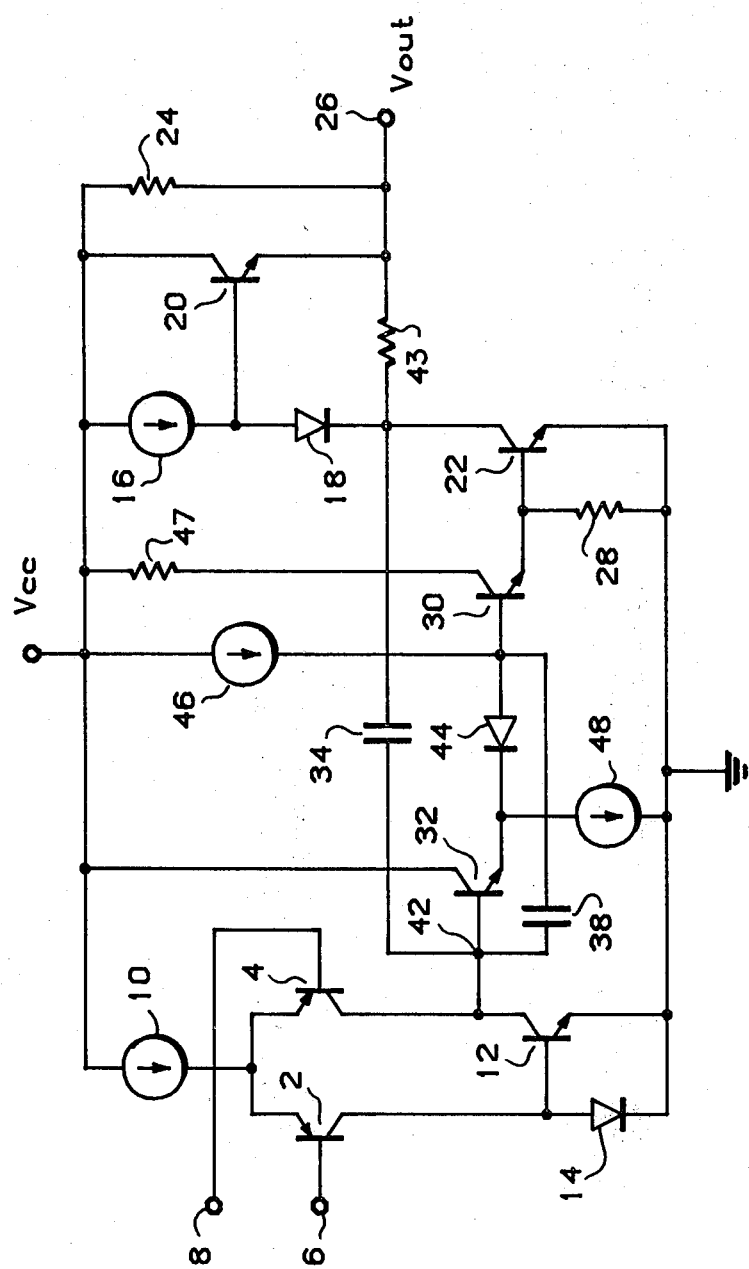
FIG. 2 is a schematic diagram of a second embodiment of the inventive operational amplifier.

It will be noted that in the circuit shown in FIG. 1, there is a voltage drop of $3V_{BE}$ between the output of the input stage (node 42) and ground, due to the base emitter voltage drops of transistors 22, 30 and 32. This DC voltage at the output of the first stage may be considered too high for some applications. FIG. 2 illustrates an arrangement which accomplishes the objectives of the circuit shown in FIG. 1 while providing a voltage drop of only $2V_{BE}$ between the output of the input stage (node 42) and the emitter of transistor 22 (ground). As can be seen, a diode 44 has been placed between transistors 30 and 32. That is, the anode of diode 44 is coupled to the base of transistor 30, and the cathode of diode 44 is coupled to the emitter of transistor 32. A first additional current source 46 is coupled between $V_{CC}$ and the anode of diode 44 while a second additional current source 48 is coupled between the cathode of diode 44 and ground. Current source 36 shown in FIG. 1 has been deleted. Starting with the emitter of transistor 22 and working towards the base of transistor 32, transistors 22 and 30 represent first and second $V_{BE}$ increases. Diode 44 however corresponds to a decrease of a single $V_{BE}$, and transistor 32 represents an additional $V_{BE}$ rise. The net effect is $2V_{BE}$ at node 42 with respect to the emitter of transistor 22 (ground). The dynamic resistance of diode 44 isolates the emitter follower 32 from the base of transistor 30 in the same functional manner as resistor 40 in FIG. 1. Capacitor 38 and capacitor 34 both perform in an identical manner as in FIG. 1.

The above description is given by way of example only. Changes in form and details may be made by one skilled in the art without departing from the scope of the invention as defined by the appended claims.

I claim:

1. An operational amplifier for providing load current to an external load, comprising:
   an input stage having at least one input transistor and an output;
   an output stage including first and second NPN output transistors each having base, emitter, and collector terminals, said first NPN output transistor having an emitter coupled to said load for conducting load current thereto and said second NPN transistor having a collector coupled to said load for sinking load current therefrom;
   first and second emitter follower transistors coupled between the output of said input transistor stage and the base of said second NPN output transistor;
   a first frequency stabilizing means coupled between the output of said input transistor stage and the collector of said second NPN output transistor for stabilizing said amplifier, said first frequency stabilizing means, said second NPN output transistor and said first and second emitter follower transistors forming a loop; and
   second frequency stabilizing means coupled to said first and second emitter follower transistors and to said first frequency stabilizing means for stabilizing said loop.

2. An operational amplifier according to claim 1 wherein said first emitter follower transistor has base, emitter and collector terminals, said base being coupled to the output of said input stage and said collector being coupled to a first source of supply voltage, and wherein said second emitter follower transistor has a base coupled to the emitter of said first emitter follower transistor, has a collector coupled to said first source of supply voltage and has an emitter coupled to the base of said second NPN output transistor.

3. An operational amplifier according to claim 2 wherein said second frequency stabilizing means comprises:
   a resistor coupled between the emitter of said first emitter follower transistor and the base of said second emitter follower transistor;
   a first capacitor coupled between the base of said first emitter follower transistor and the base of said second emitter follower transistor; and
   a first current source coupled between the base of said second emitter follower transistor and a second source of supply voltage.

4. An operational amplifier according to claim 3 wherein said first frequency stabilizing means is a second capacitor.

5. An operational amplifier according to claim 4 wherein said input stage comprises:
   a current mirror circuit;
   a second current source having a first terminal coupled to said first source of supply voltage and having a second terminal; and
   first and second PNP transistors each having an emitter coupled to said second terminal, a collector coupled to said current mirror circuit and a base coupled to one of said first and second inputs, said output appearing at the collector of one of said first and second PNP transistors.

6. An operational amplifier according to claim 5 wherein said output stage further comprises:
   a third current source coupled between said first source of supply voltage and the base at first NPN output transistor;
   a diode coupled between said third current source and the collector of said second NPN output transistor; and
   resistor means coupled between the emitter of said first NPN output transistor and the collector of said second NPN output transistor.

7. An operational amplifier according to claim 2 wherein said second frequency stabilizing means comprises:
   a first capacitor coupled between the base of said first emitter follower transistor and the base of said second emitter follower transistor;
   diode means having an anode coupled to the base of said second emitter follower transistor and a cathode coupled to the emitter of said first emitter follower transistor;
   a first current source coupled between said first source of supply voltage and the anode of said diode means; and
   a second current source coupled between the cathode of said diode means and a second source of supply voltage.

* * * * *